(12) United States Patent
Wei et al.

(10) Patent No.: US 9,159,630 B1
(45) Date of Patent: Oct. 13, 2015

(54) FIN FIELD-EFFECT TRANSISTOR (FINFET) DEVICE FORMED USING A SINGLE SPACER, DOUBLE HARDMASK SCHEME

(71) Applicant: GLOBALFOUNDRIES Inc., Grand Cayman (KY)

(72) Inventors: Andy Chih-Hung Wei, Queensbury, NY (US); Dae Geun Yang, Watervliet, NY (US); Dae-han Choi, Ludonville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/330,063

(22) Filed: Jul. 14, 2014

(51) Int. Cl.
*H01L 21/336* (2006.01)
*H01L 29/76* (2006.01)
*H01L 21/8238* (2006.01)
*H01L 27/092* (2006.01)

(52) U.S. Cl.
CPC .... *H01L 21/823821* (2013.01); *H01L 27/0924* (2013.01)

(58) Field of Classification Search
CPC ...... H01L 21/823821; H01L 21/845; H01L 21/823431; H01L 27/121; H01L 29/41791; H01L 29/66795; H01L 29/785

USPC ............ 438/283, 157; 257/347, 401
See application file for complete search history.

(56) References Cited

U.S. PATENT DOCUMENTS

| | | | |
|---|---|---|---|
| 6,762,133 B1 * | 7/2004 | Rangarajan et al. | 438/745 |
| 8,114,723 B2 | 2/2012 | Gopalakrishnan et al. | |
| 2007/0031609 A1 * | 2/2007 | Kumar et al. | 427/569 |
| 2013/0168771 A1 | 7/2013 | Wu et al. | |
| 2013/0221491 A1 * | 8/2013 | Wann et al. | 257/618 |

* cited by examiner

*Primary Examiner* — Kevin M Picardat
(74) *Attorney, Agent, or Firm* — Williams Morgan, P.C.

(57) ABSTRACT

Approaches for providing a single spacer, double hardmask dual-epi FinFET are disclosed. Specifically, at least one approach for providing the FinFET includes: forming a set of spacers along each sidewall of a plurality of fins of the FinFET device; forming a first ultra-thin hardmask over the plurality of fins; implanting the first ultra-thin hardmask over a first set of fins from the plurality of fins; removing the first ultra-thin hardmask over a second set of fins from the plurality of fins untreated by the implant; forming an epitaxial (epi) layer over the second set of fins; forming a second ultra-thin hardmask over the FinFET device; implanting the second ultra-thin hardmask; removing the second ultra-thin hardmask over the first set of fins; and growing an epi layer over the first set of fins.

20 Claims, 6 Drawing Sheets

FIN FIELD-EFFECT TRANSISTOR (FINFET) DEVICE FORMED USING A SINGLE SPACER, DOUBLE HARDMASK SCHEME

BACKGROUND

1. Technical Field

This invention relates generally to the field of semiconductors, and more particularly, to forming a FinFET using a single spacer, double hardmask dual-epi scheme.

2. Related Art

A typical integrated circuit (IC) chip includes a stack of several levels or sequentially formed layers of shapes. Each layer is stacked or overlaid on a prior layer and patterned to form the shapes that define devices (e.g., field effect transistors (FETs)) and connect the devices into circuits. In a typical state of the art complementary insulated gate FET process, such as what is normally referred to as CMOS, layers are formed on a wafer to form the devices on a surface of the wafer. Further, the surface may be the surface of a silicon layer on a silicon on insulator (SOI) wafer. A simple FET is formed by the intersection of two shapes, a gate layer rectangle on a silicon island formed from the silicon surface layer. Each of these layers of shapes, also known as mask levels or layers, may be created or printed optically through well-known photolithographic masking, developing, and level definition, e.g., etching, implanting, depositing, etc.

The FinFET is a transistor design that attempts to overcome the issues of short-channel effect encountered by deep submicron transistors, such as drain-induced barrier lowering (DIBL). Such effects make it harder for the voltage on a gate electrode to deplete the channel underneath and stop the flow of carriers through the channel—in other words, to turn the transistor off. By raising the channel above the surface of the wafer instead of creating the channel just below the surface, it is possible to wrap the gate around all but one of its sides, providing much greater electrostatic control over the carriers within it.

For FinFETs, it is desirable to be able to implant halos at the highest angle possible. As such, the gate stack needs to be as short as possible to achieve this. On the other hand, the gate stack is preferably tall so that the spacers protect the dummy gate from unwanted epi growth. However, current approaches using a tall dummy gate hardmask stack and a dual SiN spacer to form dual epi cause a large "bump" in the transition region between a N-type metal-oxide-semiconductor (NMOS) and a P-type metal-oxide-semiconductor (PMOS), which complicates the poly removal process prior to forming a replacement metal gate (RMG). As dimensions scale, dual spacers are inherently thicker and leave less room for contact. There is also less area between fins for the parasitic spacers on fin sidewalls to easily etch. Previous approaches use an oxide hardmask with a required thickness greater than 100 Å in order to have the oxide hardmask survive the epi precleans in a dilute hydrofluoric (dHF) process or equivalent oxide etch. For tight-pitch FinFETs (e.g., <60 nm), this thickness is problematic, as two hardmasks fail to leave adequate space between fins.

SUMMARY

In general, a single spacer, double hardmask dual-epi Fin-FET is provided. Specifically, at least one approach for providing the FinFET includes: forming a set of spacers along each sidewall of a plurality of fins of the FinFET device; forming a first ultra-thin hardmask over the plurality of fins; implanting the first ultra-thin hardmask over a first set of fins from the plurality of fins; removing the first ultra-thin hardmask over a second set of fins from the plurality of fins untreated by the implant; forming an epitaxial (epi) layer over the second set of fins; forming a second ultra-thin hardmask over the FinFET device; implanting the second ultra-thin hardmask; removing the second ultra-thin hardmask over the first set of fins; and growing an epi layer over the first set of fins. Use of the ultra-thin hardmasks allows for high-tilt implants, and gives a high selectivity to a nitride spacer etch, thus allowing removal of parasitic spacers on the fin sidewalls even at the tightest pitch. In an exemplary embodiment, each ultra-thin (e.g., approximately 20-30 Å) hardmask is treated (i.e., hardened) by a carbon-plasma so as to withstand a subsequent diluted hydrofluoric (dHF) acid etch. This results in a single spacer scheme together with a pair of oxide hardmasks to scale to tight fin pitches, and beneficially provides no protrusion on a transition region between NMOS and PMOS of the FinFET.

One aspect of the present invention includes a method for forming a fin field-effect transistor (FinFET) device, the method comprising: forming a set of spacers along each sidewall of a plurality of fins of the FinFET device; forming a first ultra-thin hardmask over the FinFET device; implanting the first ultra-thin hardmask over a first set of fins from the plurality of fins; removing the first ultra-thin hardmask over a second set of fins from the plurality of fins untreated by the implant; forming an epitaxial (epi) layer over the second set of fins; forming a second ultra-thin hardmask over the FinFET device; implanting the second ultra-thin hardmask; removing the second ultra-thin hardmask over the first set of fins; and growing an epi layer over the first set of fins.

Another aspect of the present invention includes a method for forming a fin field-effect transistor (FinFET) device, the method comprising: forming a set of spacers along each sidewall of a plurality of fins of the FinFET device; forming a first ultra-thin hardmask over the plurality of fins; implanting the first ultra-thin hardmask over a first set of fins from the plurality of fins; removing the first ultra-thin hardmask over a second set of fins from the plurality of fins untreated by the implant; forming an epitaxial (epi) layer over the second set of fins; forming a second ultra-thin hardmask over the FinFET device; implanting the second ultra-thin hardmask; removing the second ultra-thin hardmask over the first set of fins; and growing an epi layer over the first set of fins.

Yet another aspect of the present invention includes a semiconductor device, comprising: a gate structure over a plurality of fins formed from a substrate; a first epitaxial (epi) layer formed over a first set of fins from the plurality of fins, the first set of fins each having a first ultra-thin hardmask over a set of spacers formed on sidewalls of each of the first set of fins; a second epi layer formed over a second set of fins from the plurality of fins; and a second ultra-thin hardmask formed over each of: the second set of fins, and a section of gate structure adjacent the second set of fins.

BRIEF DESCRIPTION OF THE DRAWINGS

These and other features of this invention will be more readily understood from the following detailed description of the various aspects of the invention taken in conjunction with the accompanying drawings in which.

Figure 1:
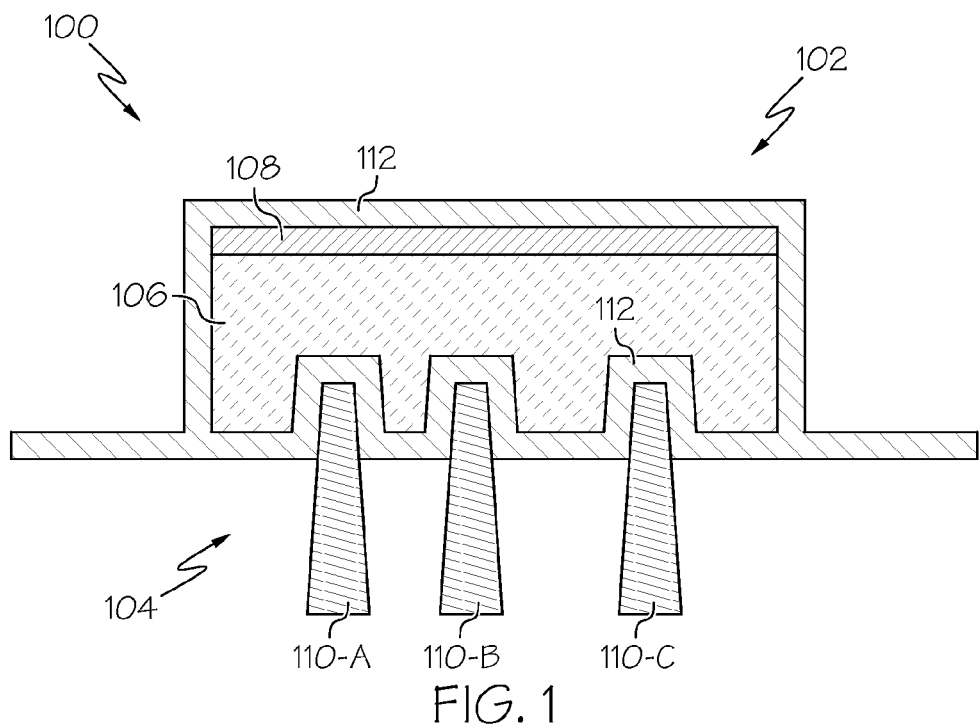
FIG. 1 shows a cross-sectional view of a device following formation of a spacer layer according to illustrative embodiments.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines, which would otherwise be visible in a "true" cross-sectional view, for illustrative clarity. Furthermore, for clarity, some reference numbers may be omitted in certain drawings.

DETAILED DESCRIPTION

Exemplary embodiments will now be described more fully herein with reference to the accompanying drawings, in which exemplary embodiments are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art.

The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

As used herein, "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UH-VCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

As stated above, approaches for providing a single spacer, double hardmask dual-epi FinFET are disclosed. Specifically, at least one approach for providing the FinFET includes: forming a set of spacers along each sidewall of a plurality of fins of the FinFET device; forming a first ultra-thin hardmask over the plurality of fins; implanting the first ultra-thin hardmask over a first set of fins from the plurality of fins; removing the first ultra-thin hardmask over a second set of fins from the plurality of fins untreated by the implant; forming an epitaxial (epi) layer over the second set of fins; forming a second ultra-thin hardmask over the FinFET device; implanting the second ultra-thin hardmask; removing the second ultra-thin hardmask over the first set of fins; and growing an epi layer over the first set of fins. Use of the ultra-thin hardmasks allows for high-tilt implants, and gives a high selectivity to a nitride spacer etch, thus allowing removal of parasitic spacers on the fin sidewalls even at the tightest pitch. In an exemplary embodiment, each ultra-thin (e.g., approximately 20-30 Å) hardmask is treated (i.e., hardened) by a carbon-plasma so as to withstand a subsequent dHF etch. This results in a single spacer scheme together with a pair of oxide hardmasks to scale to tight fin pitches, and beneficially provides no protrusion on a transition region between NMOS and PMOS of the FinFET.

With reference now to the figures, FIG. 1 shows a semiconductor device 100 (e.g., a complementary metal-oxide-semiconductor (CMOS) FinFET) including a gate structure 102 (e.g., a replacement metal gate) formed over a substrate 104. Gate structure 102 includes a dummy gate 106 (e.g., poly silicon) and a capping layer 108 (e.g., silicon nitride (SiN)). The term "substrate" as used herein is intended to include a semiconductor substrate, a semiconductor epitaxial layer deposited or otherwise formed on a semiconductor substrate, and/or any other suitable type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith. A portion of or the entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped, or contain doped regions and undoped regions therein. The semiconductor substrate may contain regions with strain and regions without strain therein, or contain regions of tensile strain and compressive strain.

Device 100 also includes a plurality of fins 110-A, 110-B, and 110-C (herein also referred to collectively as fins 110) patterned from substrate 104 by any suitable process, such as a photolithography and etching process. For example, in one embodiment, fins 110 may be formed by exposing a photoresist layer to a pattern, performing a post-exposure bake process, and developing the photoresist layer to form a masking element including the photoresist layer and the mask layer. In some embodiments, the photoresist layer patterning may include processing steps of photoresist coating, soft baking, mask aligning, exposing pattern, post-exposure baking, developing photoresist, and hard baking. In some embodiments, the patterning can also be implemented or replaced by other proper methods, such as maskless photolithography, electron-beam writing, ion-beam writing, and molecular imprint. The masking element (including the photoresist layer and the mask layer) can then be used in an etching process to etch fins 110 into the substrate 104. The etching process uses the patterned mask layer to define the area to be etched and to protect other regions of the CMOS FinFET device 100. In some embodiments, the etching process includes a wet etching process, a dry etching process, or a combination thereof. Fins 110 may be formed by an etching process using a reactive ion etch (RIE) and/or other suitable process. In one example, a hydrofluoric acid (HF) or buffered HF is used to etch the dielectric layer to expose substrate 104 according to the pattern defined by the mask layer. In another example, a dry etching process used to etch substrate 104 includes a chemistry including fluorine-containing gas. In furtherance of the example, the chemistry of the dry etch includes CF4, SF6, or NF3. Alternatively, fins 110 are formed by a double-patterning lithography (DPL) process. DPL is a method of constructing a pattern on a substrate by dividing the pattern into two interleaved patterns. DPL allows enhanced feature (e.g., fin) density. Various DPL methodologies may be used including double exposure (e.g., using two mask sets).

The resulting structure includes plurality of fins 110 having side walls being substantially orthogonal to substrate 104. In an alternative embodiment, fins 110 may be epitaxially grown from a top surface of substrate 104 within trenches or openings formed in a patterned layer atop substrate 104. In an exemplary embodiment, fins 110-A and 110-B represent fins of an N-type metal-oxide-semiconductor (NMOS) and fin 110-C represents a fin of a P-type metal-oxide-semiconductor (PMOS).

As also shown in FIG. 1, a spacer layer 112 is formed atop each of fins 110, as well as atop gate structure 102. In an exemplary embodiment, spacer layer 112 is a thin-film material conformally deposited over device 100. Spacer layer 112 is deposited such that it surrounds and isolates each of fins 110. In some embodiments, spacer layer 112 includes an insulating material such as silicon oxide, silicon nitride, silicon oxynitride, low k materials, air gap, other suitable material, or any combinations thereof. In the present embodiment, spacer layer 112 includes silicon oxide. The silicon oxide can be deposited by a CVD process. In various examples, the silicon oxide can be formed by atomic layer deposition (ALD), high density plasma CVD (HDPCVD), other suitable methods, and/or combinations thereof. The silicon oxide may be alternatively formed by a high aspect ratio process (HARP). In various embodiments, an optional thermal oxide trench liner is grown to improve the trench interface. The CVD process, for example, can use chemicals including Hexachlorodisilane (HCD or Si2Cl6), Dichlorosilane (DCS or SiH2Cl2), Bis(TertiaryButylAmino)Silane (BTBAS or C8H22N2Si) and Disilane (DS or Si2H6). In some embodiments, spacer layer 112 can have a multi-layer structure, for example, a thermal oxide liner layer with silicon nitride formed over the liner.

Figure 2:
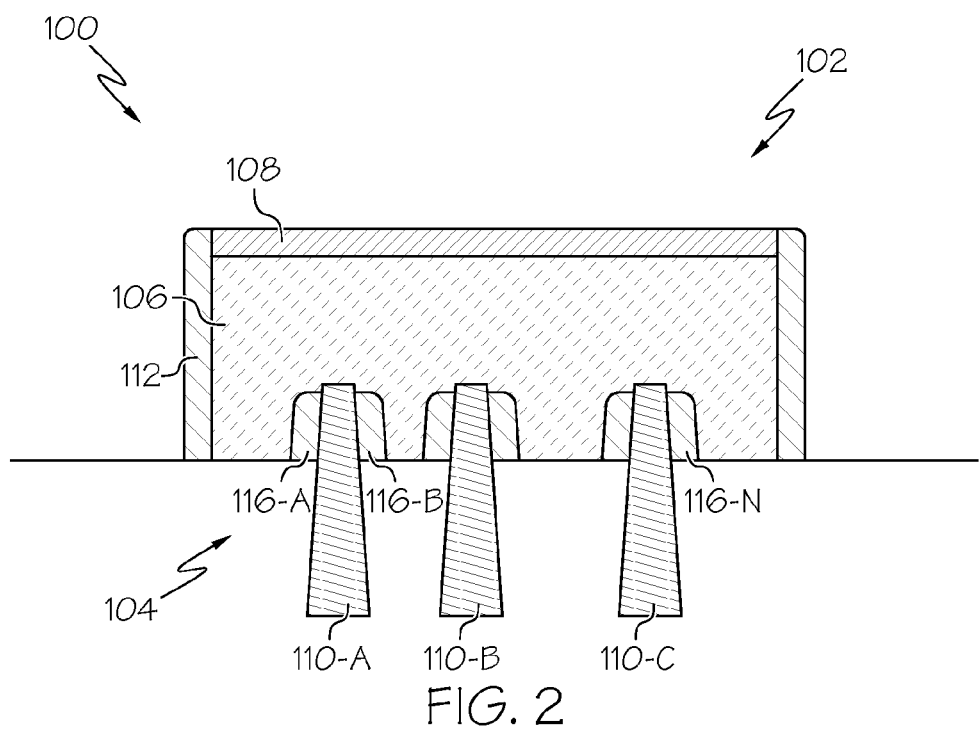
FIG. 2 shows a cross-sectional view of the device following partial removal of the spacer layer according to illustrative embodiments.
Figure 3:
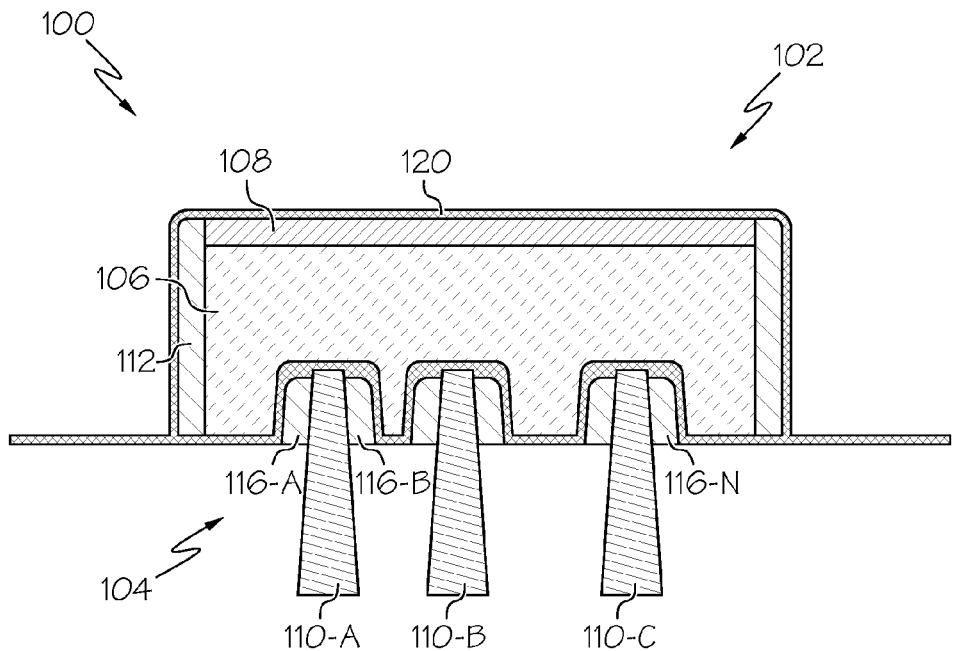
FIG. 3 shows a cross-sectional view of the device following formation of a first hardmask according to illustrative embodiments.

Device 100 is subsequently etched, as shown in FIG. 2, to remove spacer layer 112 from atop gate capping layer 108 and from atop fins 110, resulting in a set of spacers 116A-N along each sidewall of fins 110. This is followed by deposition of an ultra-thin hardmask 120 (e.g., oxide) over device 100, including over fins 110 and gate structure 102, as shown in FIG. 3. In an exemplary embodiment, hardmask 120 has a thickness of approximately 20-30 Å. In various examples, hardmask 120 can be formed by atomic layer deposition (ALD), high density plasma CVD (HDPCVD), other suitable methods, and/or combinations thereof. The CVD process, for example, may use chemicals including Hexachlorodisilane (HCD or Si2Cl6), Dichlorosilane (DCS or SiH2Cl2), Bis(TertiaryButylAmino)Silane (BTBAS or C8H22N2Si) and Disilane (DS or Si2H6).

Figure 4:
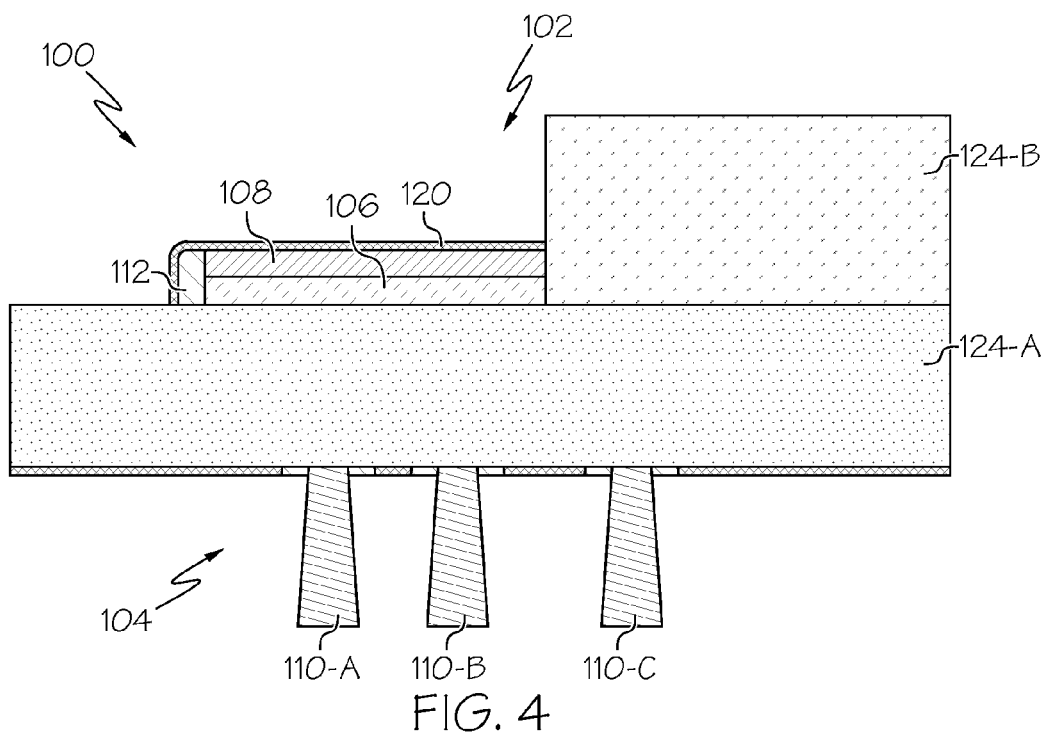
FIG. 4 shows a cross-sectional view of the device following formation of a first lithography structure according to illustrative embodiments.

Hardmask 120 is then treated using a carbon-plasma (C-plasma) implant and anneal process 128, which begins with the formation of a first lithography structure over device 100, as shown in FIG. 4. The first lithography structure comprises a bottom anti-reflective coating (BARC) layer 124-A formed over plurality of fins 110, and a photoresist layer 124-B over fin 110-C. In one embodiment, device 100 is differentially masked to partially cover the PMOS side. As shown, the lithography structure is partially open, i.e., fins 110-A and 110-B remain exposed above.

Figure 5:
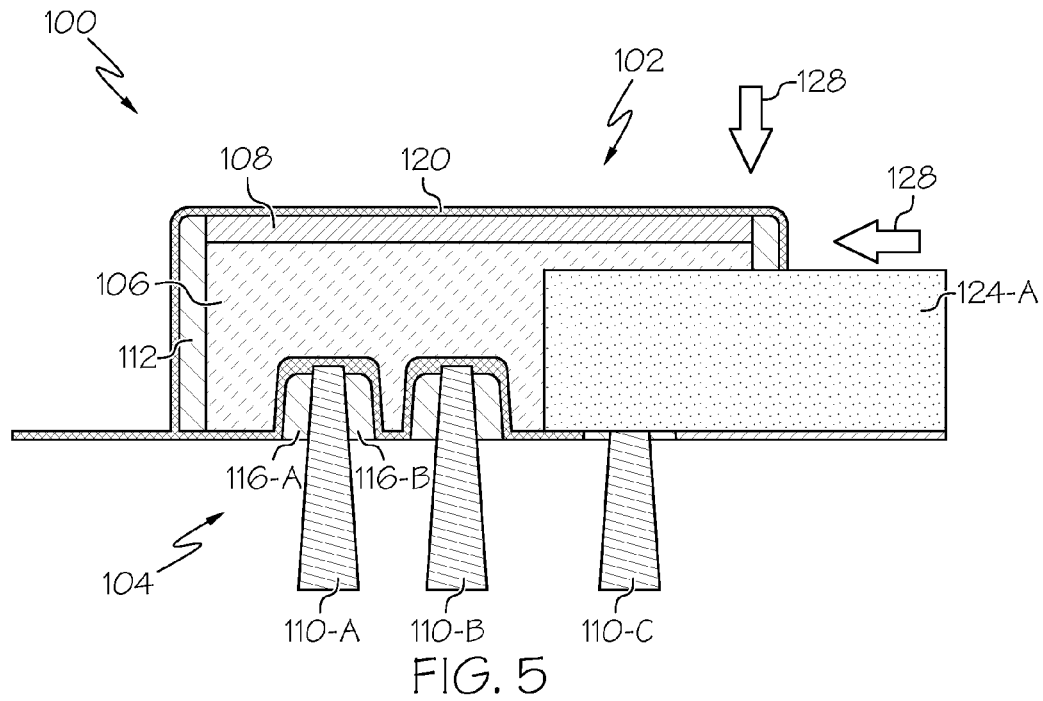
FIG. 5 shows a cross-sectional view of the device following a plasma implant according to illustrative embodiments.

BARC layer 124-A is then partially removed, along with photo resist layer 124-B, resulting in device 100 shown in FIG. 5. C-plasma and anneal process 128 is then performed to harden/carbonize hardmask 120 such that it is resistant to a dHF etch, yet able to be stripped in subsequent processing using, e.g., SiCoNi. In an exemplary embodiment, C-plasma and anneal process 128 converts the oxide film of hardmask 120 to silicon oxycarbide (SiOC), which is resistant to dHF, and allows nitride to be etched with high selectivity to oxide.

Figure 6:
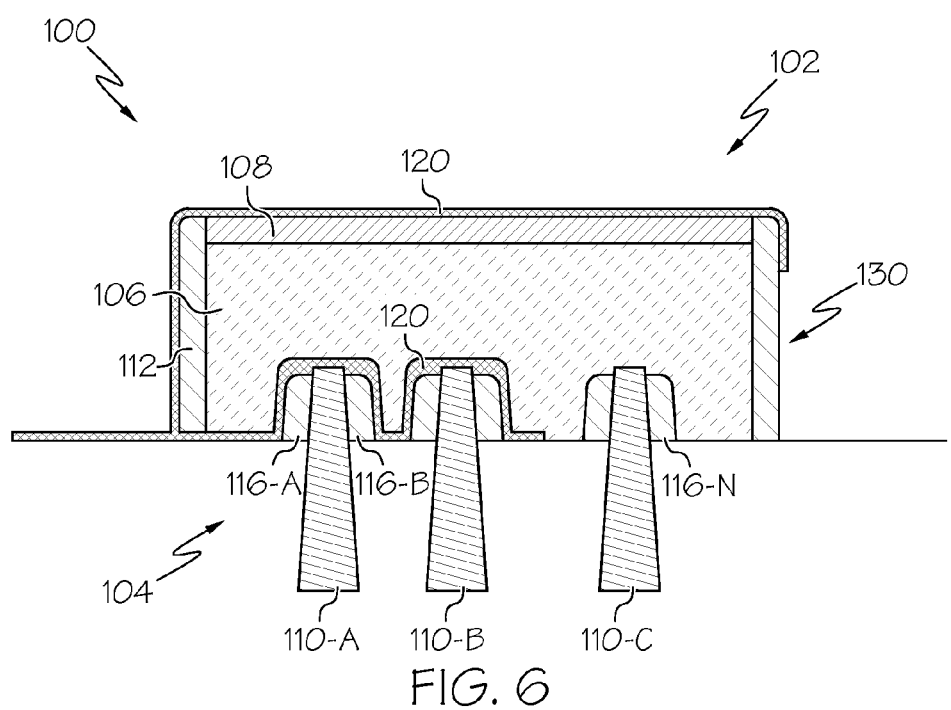
FIG. 6 shows a cross-sectional view of the device following removal of the first lithography structure according to illustrative embodiments.

The remainder of BARC layer 124-A is then removed, e.g., using a resist strip and dHF etch, resulting in device 100 shown in FIG. 6. The process used to remove the remainder of BARC layer 124-A also removes any portions or hardmask 120 that have not been hardened/carbonized via the C-plasma and anneal process. As a result, hardmask 120 is removed from fin 110-C and a sidewall section 130 of gate 102, adjacent fin 110-C, which were previously covered by BARC layer 124-A (FIG. 5).

Figure 7:
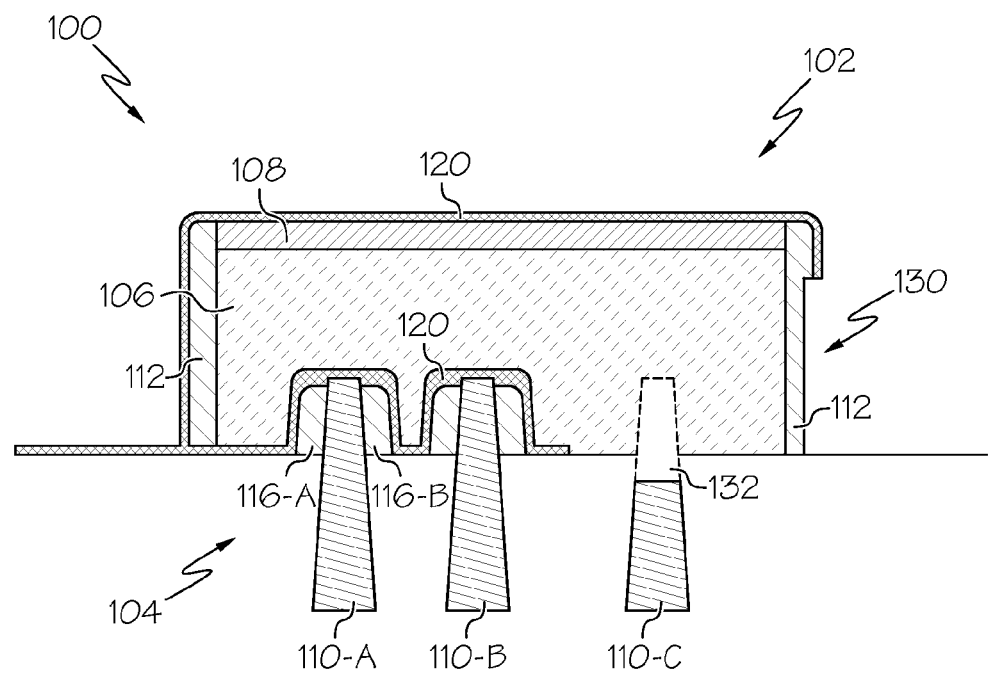
FIG. 7 shows a cross-sectional view of the device following a spacer etch and cavity etch according to illustrative embodiments.

Next, a spacer etch and PMOS cavity etch is performed, resulting in device 100 shown in FIG. 7. In an exemplary embodiment, a nitride etch, selective to the SiOC of hardmask 120, is performed to remove a top portion of fin 110-C. The etch results in a fin cavity 132, as well as isotropic removal of a portion of spacer 112 along sidewall section 130.

Figure 8:
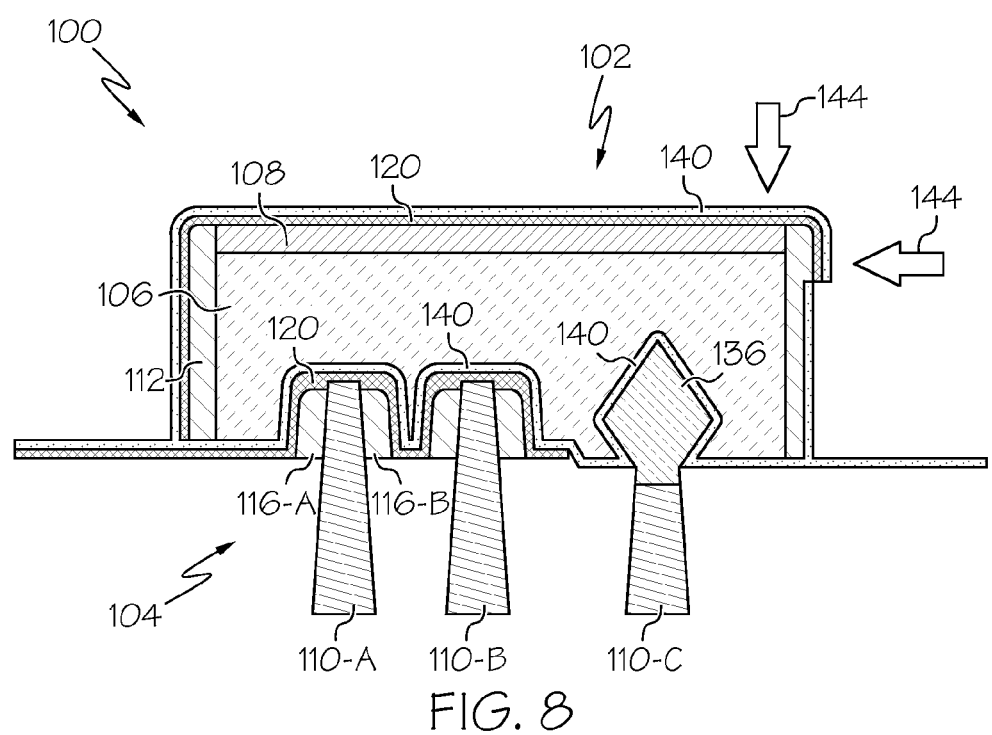
FIG. 8 shows a cross-sectional view of the device following formation of a second hardmask according to illustrative embodiments.

An epitaxial (epi) layer 136 is then formed over fin 110-C and within the cavity, as shown in FIG. 8. In exemplary embodiments, fin cavity 132 (FIG. 7) is filled with an epitaxial material, and comprises a lower section of silicon and an upper, diamond-shaped section comprised of the epitaxial material. In one embodiment, epi layer 136 includes epi silicon germanium (eSiGe). In other embodiments, epi layer 136 comprises a the III-V material such as InAs, InGaAs, InGaSb, InP, AlSb, and the like formed by an epitaxy process. The epitaxy process may include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition (e.g., silicon) of fin structure 110-C.

As further shown in FIG. 8, device 100 includes a second ultra-thin (e.g., approximately 20-30 Å) hardmask 140 formed over gate structure 102 and fins 110. In various examples, second hardmask 140 can be formed by atomic layer deposition (ALD), high density plasma CVD (HD-PCVD), other suitable methods, and/or combinations thereof. The CVD process, for example, may use chemicals including Hexachlorodisilane (HCD or $Si_2Cl_6$), Dichlorosilane (DCS or $SiH_2Cl_2$), Bis(TertiaryButylAmino)Silane (BTBAS or $C_8H_{22}N_2Si$) and Disilane (DS or $Si_2H_6$). In an exemplary embodiment, second hardmask 140 includes an oxide film, which is treated/fortified using a C-plasma and anneal process 144 to convert the oxide film of hardmask 140 to silicon oxycarbide (SiOC).

Figure 9:
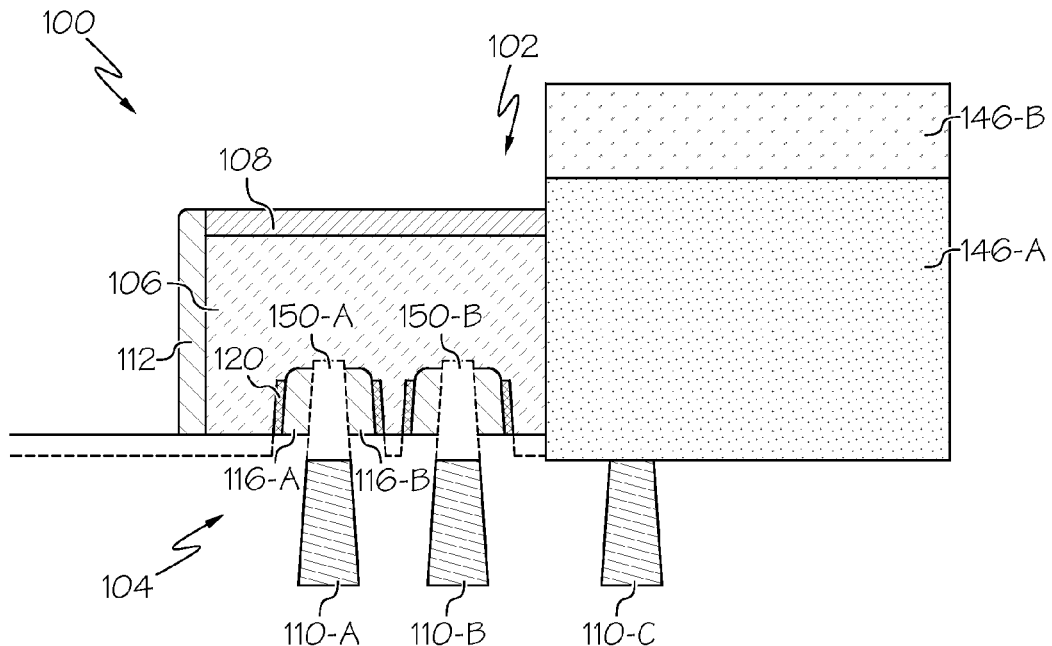
FIG. 9 shows a cross-sectional view of the device following formation of a second lithography structure according to illustrative embodiments.

Next, as shown in FIG. 9, a second lithography structure is then formed over fins 110-C. This second lithography structure can include a developable bottom antireflective coating (dBARC) layer 146-A and a photoresist layer 146-B. The second lithography structure protects fin 110-C during an anisotropic oxide spacer and fin etch process, which results in formation of cavities 150-A and 150-B within fins 110-A and 110-B, respectively, as well as the removal of all oxide left exposed by dBARC layer 146-A and photoresist layer 146-B, except for a small portion of first hardmask 120 on the sidewalls of fins 110-A and 110-B.

Figure 10:
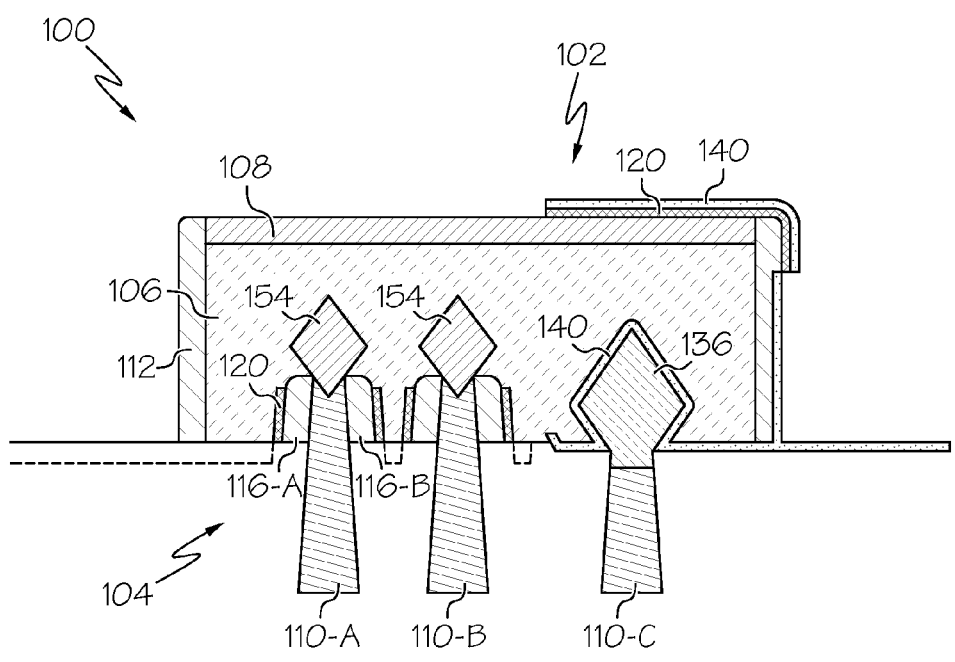
FIG. 10 shows a cross-sectional view of the device following growth of a set of epitaxial layers over a plurality of fins according to illustrative embodiments.

Following removal of dBARC layer 146-A and photoresist layer 146-B from device 100, second hardmask 140 remains over fin 110-C and over gate structure 102 in a section above/adjacent fin 110-C, as shown in FIG. 10. Also present is an epi layer 154 that has been grown over fins 110-A and 110-B, e.g., using silicon phosphorous (SiP). In an exemplary embodiment, epi layer 154 is formed within each cavity 150A-B (FIG. 9). More specifically, epi layer 154 has a confined lower portion within each cavity 150A-B, and a generally diamond-shaped portion extending upward, which results in increased epitaxial volume. The increased epitaxial volume can result in enhanced carrier mobility and improved device performance.

Figure 11:
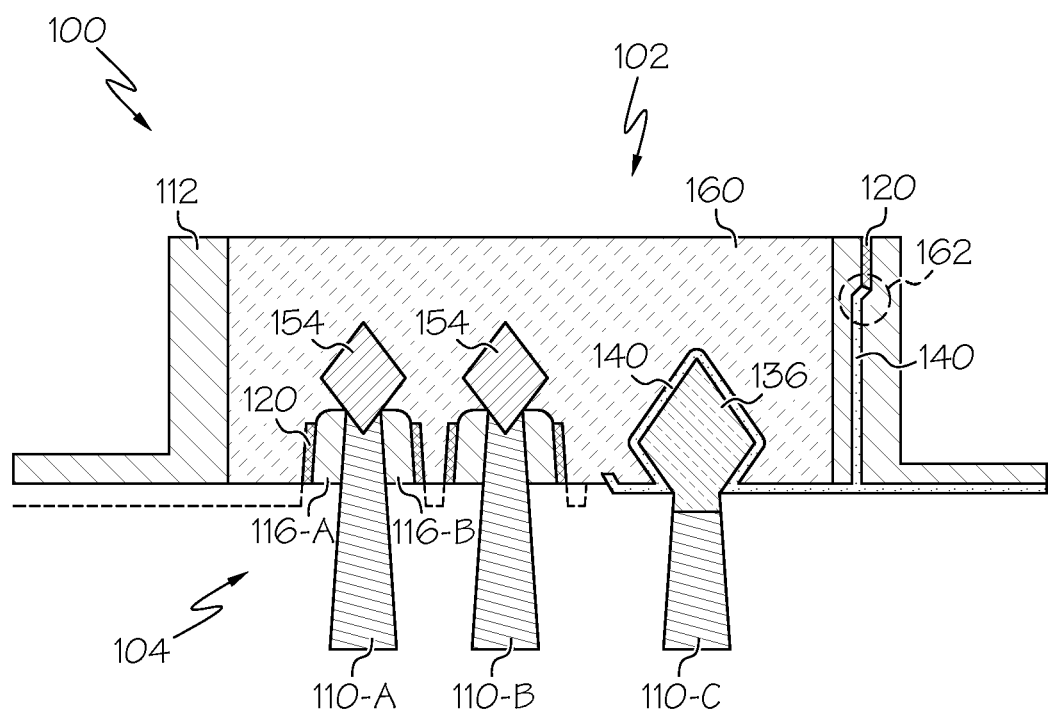
FIG. 11 shows a cross-sectional view of the device following formation of a replacement gate according to illustrative embodiments.

Next, as demonstrated by device 100 in FIG. 11, gate capping layer 108 is removed, along with dummy gate 106 (FIG. 10) to form an opening that is subsequently filled with a replacement gate material 160 (e.g., a gate oxide and/or a metal material), as shown. In this step, the previously removed gate is replaced by a metal electrode having desirable electrical characteristics or, alternatively, replaced with polysilicon, which may be salicided to achieve desirable electrical characteristics. As shown, a thin portion of hardmask 140 remains along the PMOS sidewall of gate structure 102, along with an angled notch 162 resulting from the anisotropic removal of spacer layer 112 in sidewall section 130 demonstrated in FIG. 7.

It will be appreciated that device 100 described herein and shown in FIGS. 1-11 provides a single spacer, double hardmask dual-epi FinFET. Use of the ultra-thin hardmasks allows for high-tilt implants, and gives a high selectivity to a nitride spacer etch, thus allowing removal of parasitic spacers on the fin sidewalls even at the tightest pitch. The carbon-plasma and anneal process allows each hardmask to withstand a subsequent dHF etch. This results in a single spacer scheme together with a pair of oxide hardmasks to scale to tight fin pitch, and beneficially provides no protrusion on a transition region between NMOS and PMOS of the FinFET.

In various embodiments, design tools can be provided and configured to create the datasets used to pattern the semiconductor layers as described herein. For example, datasets can be created to generate photomasks used during lithography operations to pattern the layers for structures as described herein. Such design tools can include a collection of one or more modules and can also be comprised of hardware, software, or a combination thereof. Thus, for example, a tool can be a collection of one or more software modules, hardware modules, software/hardware modules, or any combination or permutation thereof, to provide the following processing steps: forming a set of spacers along each sidewall of a plurality of fins of the FinFET device; forming a first ultra-thin hardmask over the plurality of fins; implanting the first ultra-thin hardmask over a first set of fins from the plurality of fins; removing the first ultra-thin hardmask over a second set of fins from the plurality of fins untreated by the implant; forming an epitaxial (epi) layer over the second set of fins; forming a second ultra-thin hardmask over the FinFET device; implanting the second ultra-thin hardmask; removing the second ultra-thin hardmask over the first set of fins; and growing an epi layer over the first set of fins.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

As another example, a tool can be a computing device or other appliance on which software runs or in which hardware is implemented. The tool is capable of producing a semiconductor device including: a gate structure over a plurality of fins formed from a substrate; a first epitaxial (epi) layer formed over a first set of fins from the plurality of fins, the first set of fins each having a first ultra-thin hardmask over a set of spacers formed on sidewalls of each of the first set of fins; a second epi layer formed over a second set of fins from the plurality of fins; and a second ultra-thin hardmask formed over each of: the second set of fins, and a section of gate structure adjacent the second set of fins.

It is apparent that there has been provided approaches for forming a single spacer, double hardmask dual-epi FinFET. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for forming a fin field-effect transistor (FinFET) device, the method comprising:
   forming a set of spacers along each sidewall of a plurality of fins of the FinFET device;
   forming a first ultra-thin hardmask over the FinFET device;
   implanting the first ultra-thin hardmask over a first set of fins from the plurality of fins;
   removing the first ultra-thin hardmask over a second set of fins from the plurality of fins untreated by the implant;
   forming an epitaxial (epi) layer over the second set of fins;
   forming a second ultra-thin hardmask over the FinFET device;
   implanting the second ultra-thin hardmask;
   removing the second ultra-thin hardmask over the first set of fins; and
   growing an epi layer over the first set of fins.

2. The method according to claim 1, further comprising removing, following the growth of the epi layer over the first set of fins, a capping layer from atop a gate electrode of a gate structure formed over the plurality of fins.

3. The method according to claim 2, the forming the set of spacers comprising:
   depositing a spacer layer over the gate structure and the plurality of fins; and
   etching the spacer layer from atop the gate structure and from atop the plurality of fins.

4. The method according to claim 2, the implanting the first ultra-thin hardmask comprising:
   forming a first lithography structure over the second set of fins;
   performing a carbon-plasma and anneal process to the first set of fins and to a portion of the gate structure left uncovered by the hardmask;
   removing the mask; and
   applying a diluted hydrofluoric acid (dHF) to the FinFET device.

5. The method according to claim 1, further comprising:
   etching the second set of fins to form a cavity, wherein the epi layer over the second set of fins forms within the cavity; and
   etching the spacer layer along a sidewall of the gate structure.

6. The method according to claim 1, the removing the second ultra-thin hardmask over the first set of fins comprising:
   forming a second lithography structure over the second set of fins; and
   performing an anisotropic oxide spacer etch to the FinFET device.

7. The method according to claim 6, further comprising etching the first set of fins to form a set of cavities, wherein the epi layer over the first set of fins is formed within the set of cavities.

8. The method according to claim 1, wherein the first ultra-thin hardmask and the second ultra-thin hardmask each have a thickness of approximately 20-30 Å.

9. A method for forming a fin field-effect transistor (FinFET) device, the method comprising:
   forming a set of spacers along each sidewall of a plurality of fins of the FinFET device;
   forming a first ultra-thin hardmask over the plurality of fins;
   implanting the first ultra-thin hardmask over a first set of fins from the plurality of fins;
   removing the first ultra-thin hardmask over a second set of fins from the plurality of fins untreated by the implant;
   forming an epitaxial (epi) layer over the second set of fins;
   forming a second ultra-thin hardmask over the FinFET device;
   implanting the second ultra-thin hardmask;
   removing the second ultra-thin hardmask over the first set of fins; and
   growing an epi layer over the first set of fins.

10. The method according to claim 9, further comprising removing, following the growth of the epi layer over the first set of fins, a capping layer from atop a gate electrode of a gate structure formed over the plurality of fins.

11. The method according to claim 10, the forming the set of spacers comprising:
    depositing a spacer layer over the gate structure and the plurality of fins; and
    etching the spacer layer from atop the gate structure and from atop the plurality of fins.

12. The method according to claim 10, the forming the first ultra-thin hardmask comprising:
    forming a lithography structure over the second set of fins;
    performing a carbon-plasma and anneal process to the first set of fins and to a portion of the gate structure left uncovered by the hardmask;
    removing the mask; and
    applying a diluted hydrofluoric (dHF) acid to the FinFET device.

13. The method according to claim 9, further comprising:
    etching the second set of fins to form a cavity, wherein the epi layer over the second set of fins forms within the cavity; and
    etching the spacer layer along a sidewall of the gate structure.

14. The method according to claim 9, the removing the second ultra-thin hardmask over the first set of fins comprising:
    forming a second lithography structure over the second set of fins; and
    performing an anisotropic oxide spacer etch to the FinFET device.

15. The method according to claim 14, further comprising etching the first set of fins to form a set of cavities, wherein the epi layer over the first set of fins is formed within the set of cavities.

16. The method according to claim 9, wherein the first ultra-thin hardmask and the second ultra-thin hardmask each have a thickness of approximately 20-30 Å.

17. A semiconductor device, comprising:
- a gate structure over a plurality of fins formed from a substrate;
- a first epitaxial (epi) layer formed over a first set of fins from the plurality of fins, the first set of fins each having a first ultra-thin hardmask over a set of spacers formed on sidewalls of each of the first set of fins;
- a second epi layer formed over a second set of fins from the plurality of fins; and
- a second ultra-thin hardmask formed over each of: the second set of fins, and a section of the gate structure adjacent the second set of fins.

18. The semiconductor device of claim 17, wherein the first set of fins comprise fins of an N-type metal-oxide-semiconductor, and wherein the second set of fins comprise fins of a P-type metal-oxide-semiconductor.

19. The semiconductor device of claim 17, each of the first and second ultra-thin hardmasks comprising silicon oxy carbide.

20. The semiconductor device of claim 17, each of the first and second ultra-thin hardmasks having a thickness of approximately 20-30 Å.

* * * * *